United States Patent
Dugan et al.

(10) Patent No.: US 6,244,953 B1
(45) Date of Patent: Jun. 12, 2001

(54) ELECTRONIC DEVICE FAN MOUNTING SYSTEM

(75) Inventors: John Francis Dugan, Millville; Scott David Anderson, N. Grafton, both of MA (US)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/318,165

(22) Filed: May 25, 1999

(51) Int. Cl.[7] ...................................................... H05K 7/20
(52) U.S. Cl. ............................................ 454/184; 361/695
(58) Field of Search ............................... 454/184; 361/695

(56) References Cited

U.S. PATENT DOCUMENTS

| | | | |
|---|---|---|---|
| 4,517,880 | * | 5/1985 | Buckner et al. . |
| 5,101,321 | * | 3/1992 | Remise et al. ................... 454/184 X |
| 5,707,282 | * | 1/1998 | Clements et al. ................... 454/184 |
| 5,969,941 | * | 10/1999 | Cho ................................. 454/184 X |
| 6,031,719 | * | 2/2000 | Schmitt et al. ..................... 361/695 |

* cited by examiner

*Primary Examiner*—Harold Joyce
(74) *Attorney, Agent, or Firm*—McGlew and Tuttle, P.C.

(57) ABSTRACT

A fan and chassis assembly, a fan, bracket and chassis arrangement as well as a fan and chassis system and process for providing a fan and chassis are disclosed. The assembly includes a fan, a bracket and a chassis. The fan includes a fan housing having an outer periphery. The chassis includes a sheet metal piece having an air flow opening in the region of a fan bracket receiving space. The bracket is a sheet metal fan bracket defining a fan housing receiving space and having integral fan retention elements engaging the fan housing periphery and for holding the fan in a position in the fan space. The bracket retention elements are integrally formed in the chassis and in the fan bracket respectively. The bracket retention elements include a flange bent outwardly from a chassis surface and defining a slot at a location adjacent to the fan bracket receiving space, a fan bracket flange slidably received in the slot, a first fixing element formed on the chassis and a second fixing element formed on the bracket. The first fixing element has a shape cooperating with a shape of the second fixing element.

17 Claims, 5 Drawing Sheets

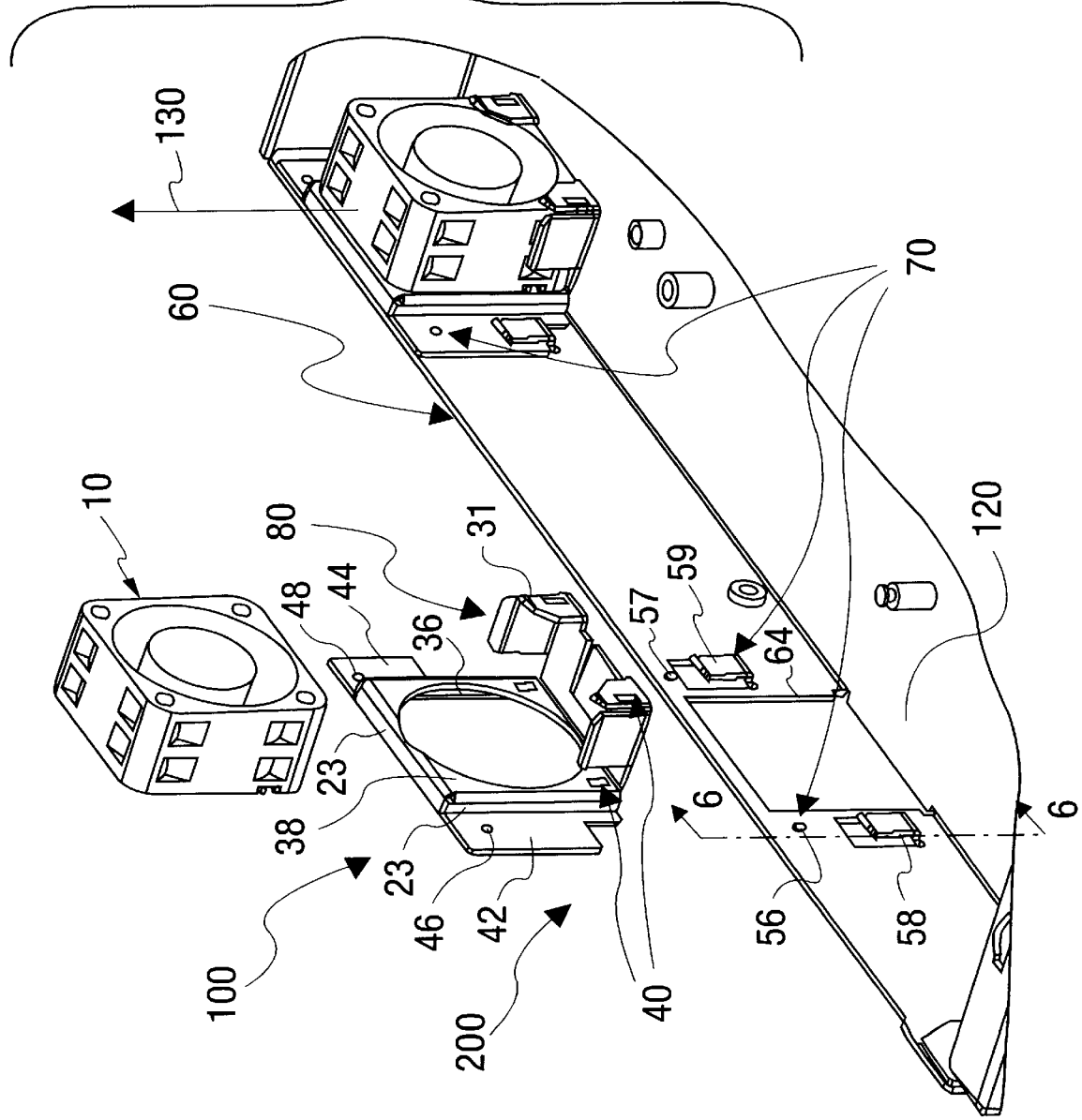

ELECTRONIC DEVICE FAN MOUNTING SYSTEM

FIELD OF THE INVENTION

The present invention relates generally to the mounting of fans in a chassis or other structure associated with an electronic device and more particularly to electronic devices having a housing with electronic components therein and having space for a cooling fan.

BACKGROUND OF THE INVENTION

Electronic devices often include one or more fans for cooling the interior space of the housing and the electronic components disposed in the housing. Particularly with computers, network systems and other devices with electronic components, the cooling of the system components is critical to the adequate function and performance of the device. Especially with devices operating at high speeds, fans are necessary for the proper operation of the device.

Often the housing or chassis of the electronic device is made from sheet steel or other sheet metal. One or more openings are provided in the housing to allow air to flow through the housing for cooling purposes. A fan assembly for a fan module or unit is positioned within the housing adjacent to the opening. The fan assembly must be secured to the chassis and preferably, the fan assembly should be removable, in case of a failure of the fan.

Various different arrangements have been provided for fixing the fan in its position. Screws and other mechanical fasteners have been used. Adhesive products may also be used.

Various fan structures have been used in the computer and network device fields. These structures often are provided as modules. The modules or units include a housing or enclosure as well as the fan apparatus. 40 mm fan units or fan modules with a 1u (1 equipment rack unit equivalent to 1.75 inch.) enclosures are often used in network applications such as for local area network hubs and concentrators. The enclosures may also be of another size (e.g., 2u, etc).

Often in both computer and network applications multiple fan units are provided. Multiple units provide some assurance as to the continued provision of cooling air flow, even if one of the units stops working. The units must nevertheless be changed to provide optimal cooling for the device.

Both the installation and the changing of fans or fan units, presents significant difficulties. As to the installation, the use of mechanical fasteners and/or adhesive backed tape, to retain the fan unit, is problematic and adds costs to the overall assembly. Further, if mechanical fasteners or adhesive backed tape are used or other fixing structure, it must be used such that it is possible to easily and efficiently take out the fan unit and replace it with a new one, in the case of fan failure.

SUMMARY AND OBJECTS OF THE INVENTION

It is a primary object of the invention to provide a fan mounting arrangement for mounting fans to move cooling air through an electronic device enclosure, without the use of fasteners or secondary manufacturing processes.

It is a further object of the invention to provide a fan assembly and a fan and chassis mounting arrangement which allows the fan to be positioned and secured relative to the housing or chassis but also allows for the replacement and removal of the fan without disturbing neighboring components in the assembled chassis.

It is a further object of the invention to provide a fan and chassis assembly including a fan mounting bracket which receives a fan unit such as a 40mm fan unit and which can be secured to the chassis wherein the securing features are fully provided in the fan bracket and in a chassis piece and wherein the fan bracket is formed of a single sheet metal piece and the chassis part is formed of a single sheet metal piece.

According to the invention, a fan and chassis mounting arrangement is provided including a fan unit, a chassis portion and bracket. The chassis has an air flow opening in the region of a fan bracket receiving space. The fan bracket defines a fan receiving space and has a fan retention system for holding a fan in the fan space. The fan unit may include a fan housing and the fan retention system includes a basket structure with substantially vertically extending surfaces for engaging the fan housing. The substantially vertically extending surfaces are flexibly movable relative to a remainder of the bracket to facilitate insertion of the fan housing.

The chassis portion and bracket may be formed of sheet metal or plastic or other materials. The chassis portion and bracket may be provided as one integral piece or may include separate bracket and chassis portions. These are preferably connected with a bracket retention system including a chassis bracket retention element integrally defined in the chassis, at a location adjacent to the fan bracket receiving space, and a bracket retention element integrally defined in said bracket. The connection is without added fasteners and without secondary assembly operations (also no tools are needed). The chassis bracket retention element has a shape cooperating with a shape of the bracket retention element. The bracket is retained in the chassis by cooperation between the chassis fan bracket retention element and the bracket retention element and without the use of a separate discrete fastening element.

The fan retention system may include dull metal barbs extending from the bracket into receiving openings formed in said fan housing. A flexing movement of the substantially vertically extending surfaces facilitates the establishment of an interference fit between the fan housing and the bracket (via the dull metal barbs).

The basket structure preferably includes a basket bottom and the substantially vertically extending surfaces include side tabs bent with respect to a surface of said basket bottom and one or more front tabs bent with respect to a surface of the basket bottom. At least one of the side tabs includes a bent angled portion defining a receiving surface. The basket bottom provides a bent flange which avoids relative vibrations at the basket and chassis interface at a bottom of the chassis.

The substantially vertically extending surfaces include surfaces defining opposed frictional securing surfaces with a another surface of the bracket. The opposed frictional surface is advantageously a front surface of a plenum defining bracket part.

The substantially vertically extending surfaces include surfaces defining opposed guiding surfaces. These facilitate the insertion of the fan and the removal of the fan.

The bracket preferably includes a portion defining a plenum chamber. The portion may have a front surface defining a fan engaging surface disposed opposite at least one of the substantially vertically extending surfaces.

The chassis retention element preferably includes one of a protruding portion and a recess portion formed in the chassis. The bracket retention element includes either a hole or one of a protruding portion and a recess portion formed in the bracket. The bracket retention element cooperates with the chassis retention element.

The bracket retention system further preferably includes side flanges forming a part of the bracket and receiving slot flanges forming a part of the chassis. The receiving slot flanges each receive an associated one of the side flanges. The bracket retention element is provided on one of said flanges and the chassis bracket retention element is provided adjacent to one of said receiving slot flanges.

The chassis bracket retention element is preferably formed of the same single sheet metal piece that forms said opening.

According to the invention, a fan and chassis assembly is also provided. The assembly includes a fan, a bracket and a chassis. The fan includes a fan housing having an outer periphery. The chassis includes a sheet metal piece having an air flow opening in the region of a fan bracket receiving space. The bracket is a sheet metal fan bracket defining a fan housing receiving space and having integral fan retention elements engaging the fan housing periphery and for holding the fan in a position in the fan space. The bracket retention elements are integrally formed in the chassis and in the fan bracket respectively. The bracket retention elements include a flange bent outwardly from a chassis surface and defining a slot at a location adjacent to the fan bracket receiving space, a fan bracket flange slidably received in the slot, a first fixing element formed on the chassis and a second fixing element formed on the bracket. The first fixing element has a shape cooperating with a shape of the second fixing element.

According to the invention, a system is provided which includes a fan bracket with a plenum chamber defining structure and a fan holding basket. The bracket is formed of a single piece of sheet metal, with bent portions. The basket has a bottom piece as well as bent side pieces and front piece opposite a front side of the plenum chamber defining structure. The bent side pieces and bent front piece are flexible and are bent to define a fan unit receiving space whereby the fan is frictionally held between the bent front piece and the front side of the plenum chamber and frictionally held between the bent side pieces. The bracket also includes side flanges. The system also includes a chassis formed by at least one sheet metal piece. The chassis has an air flow opening and slot forming flanges. The side flanges of the bracket are inserted into the slots of the slot forming flanges to position the bracket adjacent to the air flow opening and to establish the plenum chamber adjacent to the air flow opening. Securing means formed as part of the chassis at least one sheet metal piece and the bracket may be provided for securing the bracket to the chassis.

The process includes providing the system components as noted immediately above and securing a fan unit to the bracket and securing the bracket, with fan unit, to the chassis with the side flanges inserted in respective slots formed by the slot forming flanges. The bent portions of the bracket are provided to define a plenum chamber of a desired volume.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

BRIEF DESCRIPTION OF THE DRAWINGS

In the drawings:

FIG. 5 is a perspective exploded view showing the assembly for securing a fan to a chassis via a bracket, according to the system of the invention;

DESCRIPTION OF THE PREFERRED EMBODIMENT

Figure 1:
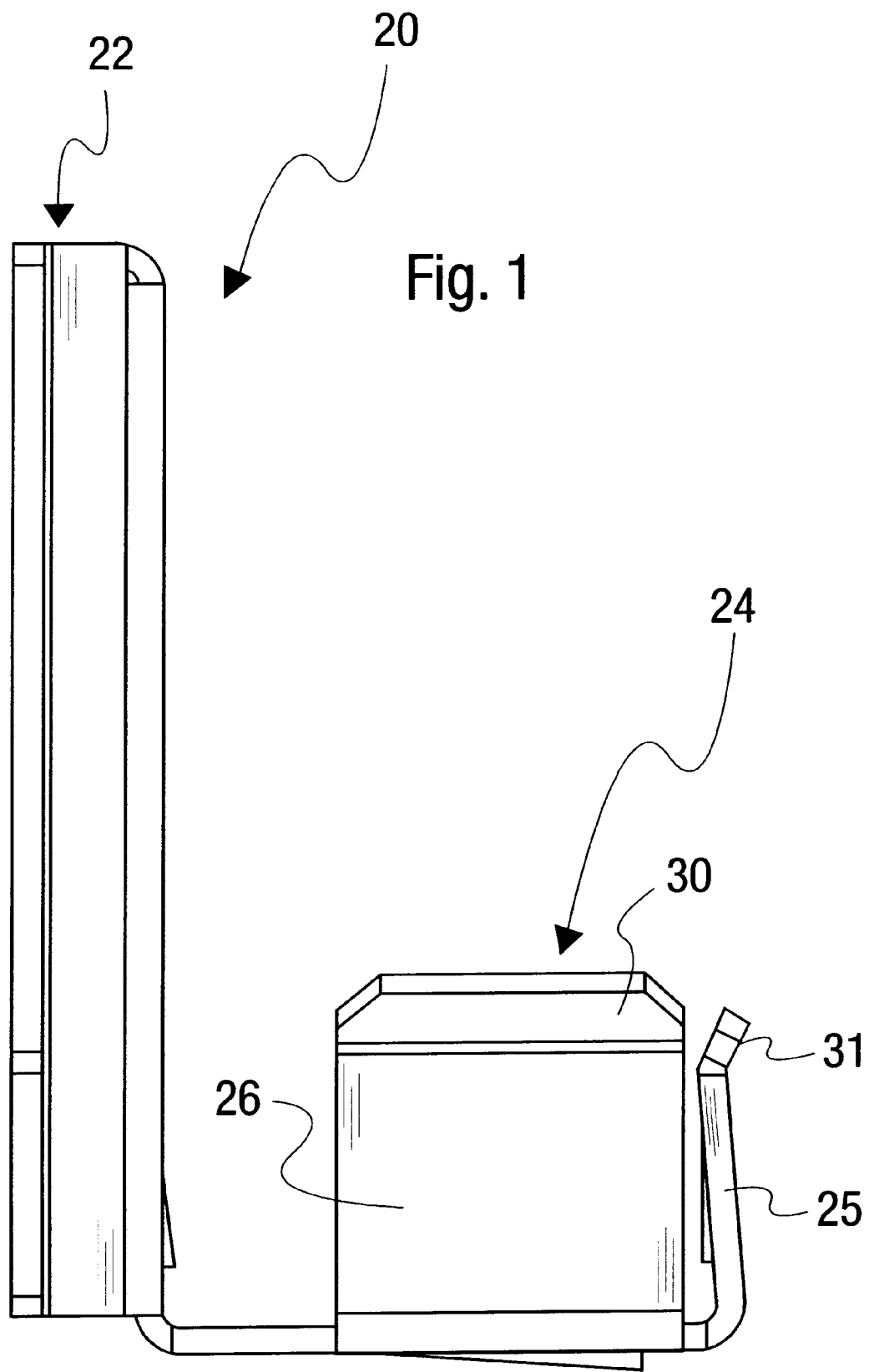
FIG. 1 is a side view of a fan mounting bracket according to the invention.
Figure 2:
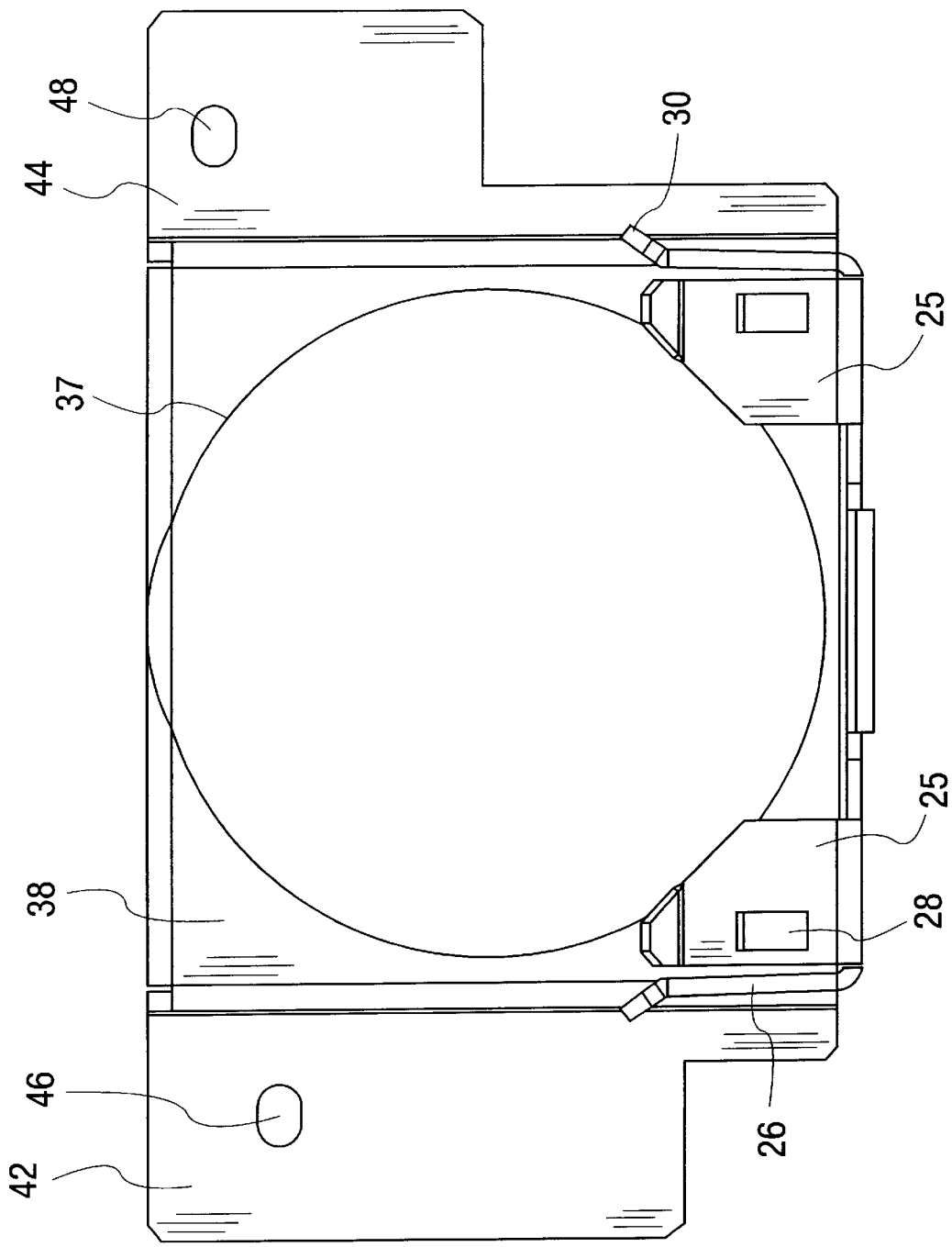
FIG. 2 is a front view of the fan mounting bracket of FIG. 1.

Referring to the drawings in particular, the invention comprises a fan mounting system for electronic devices. The system provides an arrangement for mounting a fan 10. The fan 10 may be for example a 40 mm fan which is widely used in electronic devices such as local area network systems.

The system includes a mounting arrangement generally designated 100. The system includes a chassis portion and a bracket portion generally designated 200. The chassis and bracket structure 200 may be a single unit or plural parts that together form a plenum chamber 36 as well as a securing structure 40 and insert and removal guiding interface 80. The structure 200 may be formed of a single plastic injection molded piece. The structure 200 may also be made of a single sheet metal piece or two pieces as described below.

A fan bracket 20 is provided. The fan bracket 20 includes the plenum chamber forming structure 22 made up of several bent portions. The bracket 20 also includes a basket structure 24 for receiving and supporting the fan 10. The basket receiving structure includes several vertically extending members in the form of front tabs 25 and lateral or side tabs 26. The basket structure 24 also includes a basket bottom 32. The bracket is preferably formed of a single sheet metal piece disposed in the chassis at a bracket location 120.

Figure 3:
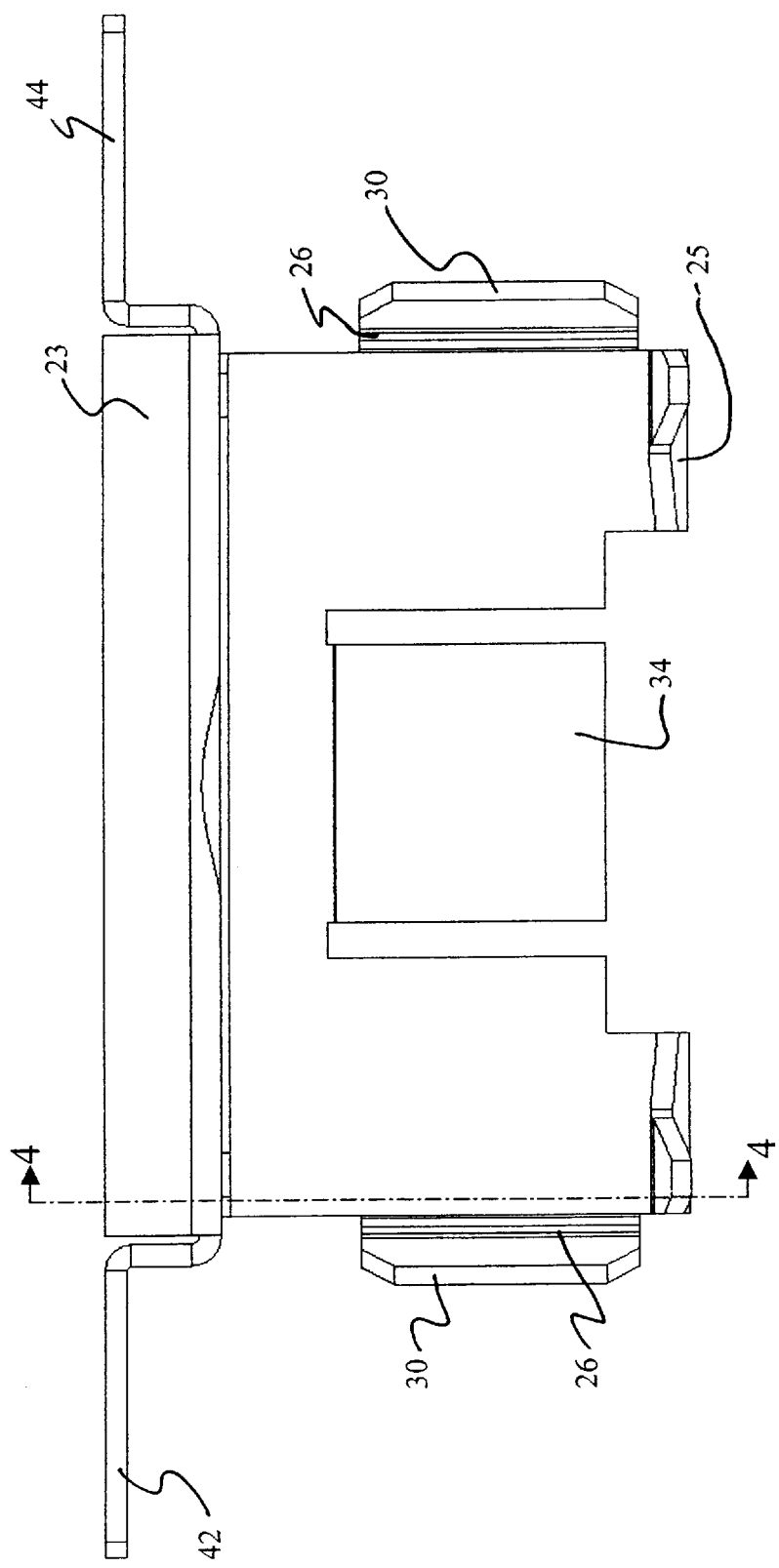
FIG. 3 is a top view of the fan mounting bracket according to FIG. 1.

The tabs 25 and 26 are made to extend substantially vertically by bending the tabs such that they extend about at 90° with respect to the basket bottom 32. These tabs can move or flex relative to the remainder of the basket. Additionally, cuts are made in the basket bottom to form a basket bottom tab portion 34. The basket bottom tab portion 34 is bent slightly out of the plane of the basket bottom by an amount labeled BT in FIG. 4. As can be seen particularly in FIGS. 3 and 1, the side tabs 26 preferably have a bent angled portion 30. Additionally, the front tabs 25 may also have a bent angled portion 31. The bent angled portions 30 and 31 flexing of the tabs facilitate the positioning of the fan housing 12 in the basket 24.

The plenum chamber forming structure 22 defines an air plenum chamber 36. The chamber has a volume based on the dimension of the side, top and bottom walls of the plenum forming portions 23. These walls are bent portions. The volume of the plenum chamber may be varied by simply changing the dimension of the portions 23. This will change the distance between a plenum portion front surface 38 and the plane of a chassis forming sheet metal member 62. The plenum portion front surface 38 defines an opening 37 for air to pass from the plenum chamber 36 to the fan unit 10.

According to a preferred embodiment of the invention as shown in the figures, the front tabs 25 are each provided with barbs, namely dull metal barbs 28. Additionally, the plenum portion front surface 38 also has dull metal barbs 39 formed in the sheet metal. The bracket 20 receives the fan housing 12 as the fan housing is placed into the basket 24. As the fan 10 is pushed downwardly, the dull metal barbs 39 and the dull metal barbs 28 provide an enhancement to the frictional securing function of the tabs 25 and front surface 38.

Figure 4:
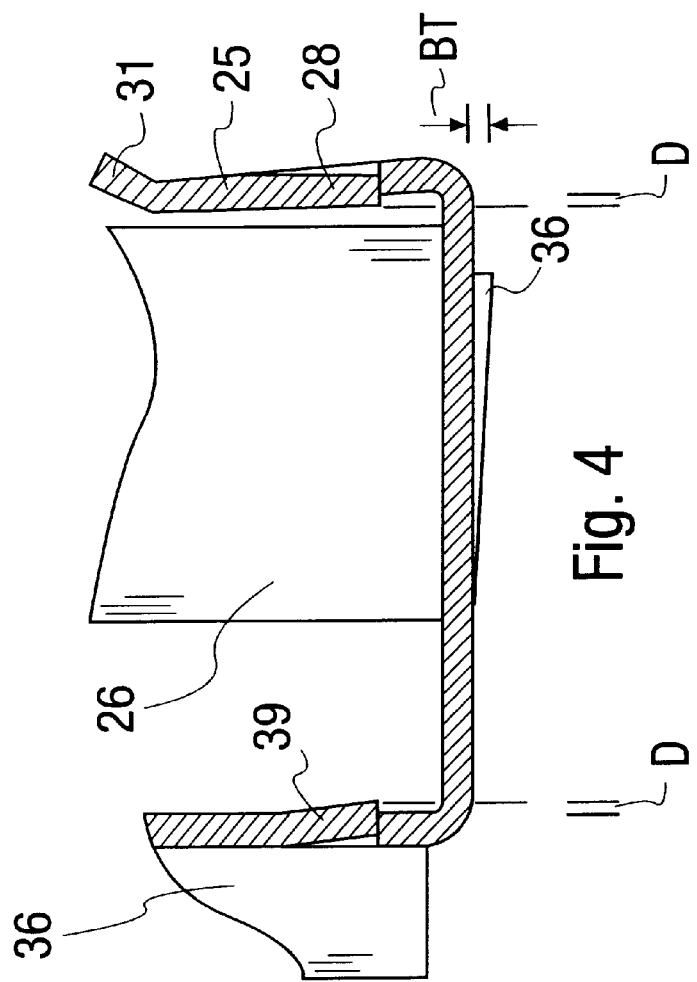
FIG. 4 is a broken away sectional view taken along line 4—4 of FIG. 3.
Figure 6:
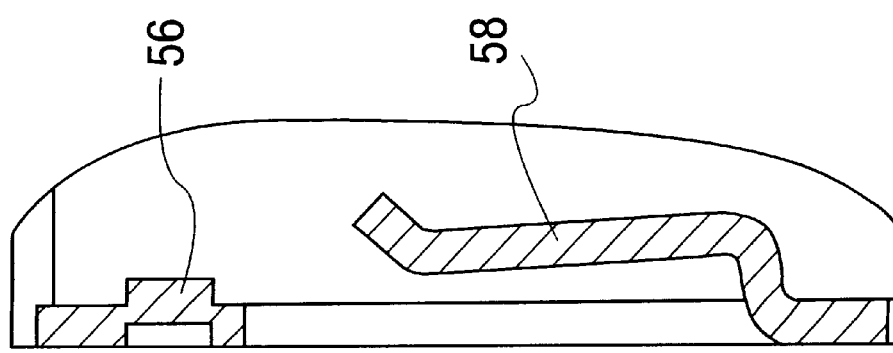
FIG. 6 is a sectional view taken along line 6—6 of FIG. 5.

As can be seen in FIG. 4, the barbs 28 and 39 are formed as cut portions in the bracket and these are displaced relative to the surrounding material by an amount D. The provision of the basket 24 with barbs or tabs 28 and 39 cooperates with the tabs 26 to form a fan retention system generally designated 40 (see FIG. 5).

As can be seen in FIG. 5, the provision of the basket 24 with tabs 25 and 26 with guide surfaces 30 and 31 form a guide system. The guide system facilitates insertion and removal. The guide surfaces 30 and 31 provide a centering and guide function for insertion. The surfaces (particularly surfaces 30) provide a guide for a tilting guided removal as a tab 26 bends laterally. That is, the fan is rocked with one tab 26 bending out and is removed generally in the direction 130.

The bracket 20 also includes a first side flange 42 and a second side flange 44. The plenum portion front surface 38 defines the opening 37 so it will be spatially coordinated with the air flow opening 64. Each side flange has an opening but this may also be one of a protruding portion or recess portion. That is for example side flange 42 has an opening 46 and side flange 44 has an opening 48. Although the embodiment provides openings formed by the bracket, the portion may either be an opening, a protruding portion or a recess portion to cooperate with a complementary part as further described below.

As can be seen in FIG. 5, the chassis 60 is formed with at least one sheet metal piece 62. This sheet metal piece 62 includes the air flow opening 64. The air flow opening 64 is preferably formed as a cut-out in the sheet piece 62. Additionally, a cut-out is made to provide a receiving slot flange 58 and a receiving slot flange 59. The flanges 58 and 59 are bent out of the plane of the sheet metal piece 62 to form slots, namely a gap (e.g., approximately 75% of the thickness of bracket 20) between the plane of the flange and the plane of the remainder of the sheet metal piece 62. The slots formed by flanges 58 and 59 receive the side flanges 42 and 44 of the bracket 20 as shown in FIG. 5. Additionally, the sheet metal 62 is provided with protruding portions 56 and 57, which are disposed above these slot forming flanges 58 and 59 respectively. The protruding portions 56 and 57 may instead be recess portions or may be holes. However, it is proven to be convenient to provide the portion 46 and 48 as holes and to provide the portions 56 and 57 as protruding portions. The holes 46 and 48 are complimentary to the protruding portions 46 and 57. The slot forming flanges 58, 59 the protruding portions 56 and 57 cooperate with the side flanges 42 and 44 and the openings 56 and 48 to define a bracket retention system 70.

To provide the assembly, the fan unit 10 is disposed in an assembled state with the bracket 20 by positioning the housing 12 in the basket 24. The front surface 38 is in contact with a surface of the housing 12 and the tabs 26 and 25 come into contact with the housing 12. Additionally, the dull metal barbs 28 and 39 extend into frictional contact with the fan 10. This maintains the fan unit 10 in a secured and assembled state with the bracket 20. The bracket 20 and fan unit 10, in the assembled state, are then disposed in a fan bracket receiving space 100 which is adjacent to the airflow opening 64. The bracket 20 with fan unit 10 slides downwardly such that the side flanges 42 and 44 are received in the slot defined by receiving slot flanges 58 and 59. As the bracket reaches its lower most position, the protruding parts 56 and 57 slide over the rear surface of the side flanges 42 and 44 until the protruding parts 56 and 57 are received in the openings 46 and 48 respectively. Basket bottom tab portion 34 deflects part of the distance BT (FIG. 4) to provide vertical tension between 46/56 and 40/57 (to provide noise avoidance by avoiding a loose fit). This secures the fan unit 10 and the bracket 20 to the chassis part 62 of chassis 60. Further, this securing is accomplished with only two sheet metal parts.

While specific embodiments of the invention have been shown and described in detail to illustrate the application of the principles of the invention, it will be understood that the invention may be embodied otherwise without departing from such principles.

What is claimed is:

1. A fan and chassis assembly, comprising:

a fan assembly including a fan housing having an outer periphery;

a sheet metal chassis having a vertical wall with an air flow opening in the region of a fan bracket receiving space;

a sheet metal fan bracket formed of a single sheet metal piece, said fan bracket defining a fan housing receiving space and having integral fan retention elements engaging said fan housing periphery and for holding said fan in a position in said fan space;

bracket retention elements integrally formed in said chassis and in said fan bracket, said bracket retention elements including a flange bent outwardly from a chassis surface and defining a slot at a location adjacent to said fan bracket receiving space, said slot having a slot open upper end and said flange closing said slot at a lower end, a fan bracket flange slidably received in said slot by insertion of said fan bracket in a substantially vertical direction from above, a first fixing element formed on said chassis and a second fixing element formed on said bracket, said first fixing element having a shape cooperating with a shape of said second fixing element to hold said fan bracket in said chassis.

2. An arrangement according to claim 1, wherein said fan bracket is a basket structure, said fan retention elements comprising vertically extending surfaces for engaging said fan assembly housing, said substantially vertically extending surfaces being flexibly movable relative to a remainder of said bracket for receiving said fan housing from above, in a vertical direction to facilitate insertion of said fan housing.

3. An arrangement according to claim 2, wherein said fan retention elements include friction surfaces for frictionally engaging said fan housing, and wherein flexing movement of said substantially vertically extending surfaces facilitates the establishment of an interference fit between said fan housing and said friction surfaces.

4. An arrangement according to claim 3, wherein said friction surfaces include dull metal barbs extending from said bracket into receiving openings formed in said fan housing, and wherein flexing movement of said substantially vertically extending surfaces facilitates the establishment of an interference fit between said fan housing and said dull metal barbs.

5. An arrangement according to claim 2, wherein said basket structure includes a basket bottom and said substantially vertically extending surfaces include side tabs bent with respect to a surface of said basket bottom and front tabs bent with respect to a surface of said basket bottom, at least one of said side tabs includes a bent angled portion defining a receiving surface.

6. An arrangement according to claim 1, wherein said basket structure includes a basket bottom and said substantially vertically extending surfaces include side tabs bent with respect to a surface of said basket bottom and front tabs bent with respect to a surface of said basket bottom, at least one of said side tabs includes a bent angled portion defining a receiving surface.

7. An arrangement according to claim 1, wherein said bracket includes a portion defining a plenum chamber, said portion having a front surface defining a fan housing engaging surface disposed opposite at least one of said retention elements.

8. An arrangement according to claim 1, wherein said chassis retention element includes one of a protruding portion and a recess portion formed in said chassis and said bracket retention element includes one of a protruding portion and a recess portion formed in said bracket and cooperating with said chassis retention element.

9. A method of providing a chassis and removable fan for an electronic device, the method comprising:
providing a fan unit including a fan apparatus and with a fan housing;
providing a chassis with an air flow opening and a fan bracket with bent portions defining a plenum chamber and bent portions defining a fan holding basket with a bottom piece as well as bent side pieces and a bent front piece, opposite a front side of one of the portions defining the plenum chamber, the bent side pieces and bent front piece being provided to be flexible and being bent to define a fan unit receiving space;
positioning the fan unit in the basket of the bracket to frictionally hold the fan unit between the bent front piece and the front side of the plenum chamber forming portion and to frictionally hold the fan unit between the bent side pieces.

10. The method according to claim 9, further comprising:
providing the bracket as an element separate from said chassis;
providing the bracket with side flanges
forming a chassis with a an air flow opening;
forming flanges in the chassis bent out of a plane of the chassis to form slots;
inserting the bracket into the chassis and inserting the side flanges of the bracket into the slots to position the bracket adjacent to the air flow opening and to establish the plenum chamber adjacent to the air flow opening.

11. A method according to claim 10, further comprising forming a chassis securing part of chassis sheet metal piece and forming a bracket securing part on said bracket, wherein said chassis securing part has a shape which is complementary to bracket securing part.

12. A method according to claim 10, further comprising rocking the fan and bending one of said bent portions defining said fan holding basket to remove said fan from said chassis and fan bracket.

13. A fan and chassis assembly, comprising:
a fan assembly including a fan housing having an outer periphery;
a sheet metal chassis having a vertical sheet metal wall defining an air flow opening in the region of a fan bracket receiving space and having a vertically extending chassis flange bent outwardly from said sheet metal wall defining a slot at a location adjacent to said fan bracket receiving space, said slot having a slot open upper end and said flange terminating at a closed slot lower end;
a single piece fan bracket with bent portions defining a plenum chamber and bent portions defining a basket structure including a basket bottom and fan retention elements comprising vertically extending surfaces for engaging said fan assembly housing, said substantially vertically extending surfaces being flexibly movable relative to a remainder of said bracket for receiving said fan housing from above, in a vertical direction to facilitate insertion of said fan housing, said basket defining a fan housing receiving space and said substantially vertically extending surfaces include side tabs bent with respect to a surface of said basket bottom and front tabs bent with respect to a surface of said basket bottom, at least one of said side tabs includes a bent angled portion defining a receiving surface having integral fan retention elements engaging said fan housing periphery and for holding said fan in a position in said fan space, said fan bracket having a vertically extending flange slidably received in said slot by insertion of said fan bracket in a substantially vertical direction from above; and
bracket retention elements integrally formed in said chassis and in said fan bracket, said bracket retention elements including a first fixing element formed on said chassis and a second fixing element formed on said bracket, said first fixing element having a shape cooperating with a shape of said second fixing element to hold said fan bracket in said chassis.

14. An assembly according to claim 13, wherein the bracket is formed of a single sheet metal piece.

15. A method of providing a chassis and removable fan for an electronic device, the method comprising:
providing a fan unit including a fan apparatus and with a fan housing;
providing a sheet metal chassis with a vertical sheet metal wall;
forming an air flow opening in the vertical sheet metal wall;
forming a flange in the vertical sheet metal walls by bending a portion of the vertical sheet metal wall out of a vertical plane of the vertical sheet metal wall and disposing the flange substantially in another plane parallel to said vertical plane of the vertical sheet metal wall of the chassis to form a slot with an upper opening;
forming a fan bracket from a single sheet metal piece including bending portions to define a plenum chamber, bending portions to define a fan holding basket with a bottom piece as well as bent side pieces and a bent front piece, opposite a front side of one of the portions defining the plenum chamber, the bent side pieces and bent front piece being provided to be flexible and being bent to define a fan unit receiving space and providing a portion forming vertically extending bracket flange;
inserting the fan unit vertically into the basket of the bracket to frictionally hold the fan unit between the bent front piece and the front side of the plenum chamber forming portion and to frictionally hold the fan unit between the bent side pieces;

inserting the bracket vertically downwardly into the chassis and inserting the bracket flange into the slot to position the bracket adjacent to the air flow opening and to establish the plenum chamber adjacent to the air flow opening.

16. A method according to claim 15, further comprising forming a chassis securing part of chassis sheet metal piece and forming a bracket securing part on said bracket, wherein said chassis securing part has a shape which is complementary to bracket securing part.

17. A method according to claim 15, further comprising rocking the fan and bending one of said bent portions defining said fan holding basket to remove said fan from said chassis and fan bracket.

* * * * *